United States Patent
Ruby et al.

[11] Patent Number: 6,060,818
[45] Date of Patent: May 9, 2000

[54] SBAR STRUCTURES AND METHOD OF FABRICATION OF SBAR.FBAR FILM PROCESSING TECHNIQUES FOR THE MANUFACTURING OF SBAR/BAR FILTERS

[75] Inventors: Richard C. Ruby, Menlo Park; Yogesh Desai, San Jose; Donald R. Bradbury, Palo Alto, all of Calif.

[73] Assignee: Hewlett-Packard Company, Palo Alto, Calif.

[21] Appl. No.: 09/088,964

[22] Filed: Jun. 2, 1998

[51] Int. Cl.⁷ ................................................. H01L 41/08
[52] U.S. Cl. ........................... 310/363; 310/349; 29/25.35
[58] Field of Search .................................. 310/349, 363; 29/25.35

[56] References Cited

U.S. PATENT DOCUMENTS 5,587,620  12/1996  Ruby et al. .............................. 310/346
5,873,153  2/1999   Ruby et al. .............................. 29/25.35

Primary Examiner—Thomas M. Dougherty

[57] ABSTRACT

An acoustical resonator and a method for making the same. A resonator according to the present invention includes a layer of piezoelectric material sandwiched between first and second electrodes. The first electrode includes a conducting sheet having a RMS variation in height of less than 2 $\mu$m. The resonator bridges a cavity in a substrate on which the resonator is constructed. The resonator is constructed by creating a cavity in the substrate and filling the same with a sacrificial material that can be rapidly removed from the cavity after the deposition of the various layers making up the resonator. The surface of the filled cavity is polished to provide a RMS variation in height of less than 0.5 $\mu$m. The first electrode is deposited on the polished surface to a thickness that assures that the RMS variation in height of the metallic layer is less than 2 $\mu$m. The piezoelectric layer is deposited on the first electrode and the second electrode is then deposited on the piezoelectric layer. The sacrificial material is then removed from the cavity by opening vias into the cavity and removing the material through the vias. The preferred sacrificial material is phophor-silica-glass.

13 Claims, 3 Drawing Sheets

SBAR STRUCTURES AND METHOD OF FABRICATION OF SBAR.FBAR FILM PROCESSING TECHNIQUES FOR THE MANUFACTURING OF SBAR/BAR FILTERS

FIELD OF THE INVENTION

The present invention relates to acoustic resonators, and more particularly, to resonators that may be used as filters for electronic circuits.

BACKGROUND OF THE INVENTION

The need to reduce the cost and size of electronic equipment has led to a continuing need for smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that has the potential for meeting these needs is constructed from acoustic resonators. These devices use bulk longitudinal acoustic waves in thin film piezoelectric (PZ) material. In one simple configuration, a layer of PZ material is sandwiched between two metal electrodes. The sandwich structure is suspended in air by supporting it around the perimeter. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a filter. The mechanical resonant frequency is that for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions less than 100 microns in diameter and few microns in thickness.

At the heart of Thin Film Bulk Acoustic Resonators (FBARs) and Stacked Thin Film Bulk Wave Acoustic Resonators and Filters (SBARs) is a thin sputtered piezoelectric film having a thickness on the order of one to two microns. Electrodes on top and bottom sandwich the piezoelectric acting as electrical leads to provide an electric field through the piezoelectric. The piezoelectric, in turn, converts a fraction of the electric field into a mechanical field. A time varying "stress/strain" field will form in response to a time-varying applied electric field.

To act as a resonator, the sandwiched piezoelectric film must be suspended in air to provide the air/crystal interface that traps the sound waves within the film. The device is normally fabricated on the surface of a substrate by depositing a bottom electrode, the PZ layer, and then the top electrode. Hence, an air/crystal interface is already present on the topside of the device. A second air/crystal interface must be provided on the bottom side of the device. There are several prior art approaches for obtaining this second air/crystal interface.

The first approach involves etching away the wafer that forms the substrate. If the substrate is silicon, the silicon is etched away from the backside using hot KOH. This leaves the resonator constructed on the front side of the wafer supported by its edges. The holes made through such a wafer render the wafer very delicate and highly susceptible to breakage. Furthermore, using wet etches such as KOH with their 54.7 degree etch slope limits the ultimate density and thus the yield of FBAR/SBAR filters on a wafer. For example, devices with lateral dimensions of approximately 150 $\mu$m by 150 $\mu$m build on a standard 530 $\mu$m thick silicon wafer, require a backside etch hole roughly 450 $\mu$m by 450 $\mu$m. Hence, only about $\frac{1}{9}^{th}$ of the wafer can be productively utilized.

The second prior art method for providing an air/crystal interface under the device is to create an air-bridge type FBAR/SBAR device. Typically, a sacrificial layer is first laid down, and the device is then fabricated on top of this sacrificial layer. At or near the end of the process the sacrificial layer is removed. Since all of the processing is done on the front side, this approach does not suffer from having two-sided alignment and large area backside holes. However, this approach is not without inherent difficulties. First, the method is difficult to practice on large devices. Typically, the sacrificial layer is thermally grown $SiO_2$ which is removed using HF. The etch rate is of the order of 1000 to 3000 A/minute. To etch under device areas that are on the order of 150 $\mu$m by 150 $\mu$m or larger, an etch time greater than 500 minutes is needed. In addition to being excessively long, the exposure of the metal electrodes to the etchant for periods in excess of 30 minutes leads to the delamination of the metal electrodes from the piezoelectric layer.

The third prior art approach is referred to as the solidly mounted resonator (SMR), since there are no air gaps under the devices. The large acoustic impedance at the bottom of the device is created by using an acoustic Bragg reflector. The Bragg reflector is made up of layers of alternating high and low acoustic impedance materials. Each thickness is fixed to be at the quarter wavelength of the resonant frequency. With sufficient layers, the effective impedance at the piezoelectric/electrode interface is much higher than the device acoustic impedance, thus trapping the sound waves effectively in the piezoelectric.

While this approach avoids the problems discussed above in creating a free standing membrane, it has a number of problems. The choice of materials used in the Bragg reflector is limited, since metals cannot be used for these layers because the metal layers would form parasitic capacitors that degrade the electrical performance of the filters. The degree of difference in the acoustic impedance of layers made from the available dielectric materials is not large. Accordingly, more layers are needed. This complicates the fabrication process as the stress on each layer must be well controlled. After many layers, the device is not conducive to integration with other active elements, since making vias through 10 to 14 layers is difficult. Furthermore, the devices reported to date have significantly lower effective coupling coefficients than devices having air bridges. As a result, filters based on SMRs exhibit reduced effective bandwidths compared to air bridge devices.

Broadly, it is the object of the present invention to provide an improved FBAR/SBAR device.

It is a further object of the present invention to provide an FBAR/SBAR device that does not require back etching of the substrate.

It is a still further object of the present invention to provide an FBAR/SBAR device that does not require excessively long etch times to create an air gap under the device.

These and other objects of the present invention will become apparent to those skilled in the art from the following detailed description of the invention and the accompanying drawings.

SUMMARY OF THE INVENTION

The present invention is an acoustical resonator and a method for making the same. A resonator according to the present invention includes a layer of piezoelectric material sandwiched between first and second electrodes. The first electrode includes a conducting sheet having a RMS variation in height of less than 2 μm. The resonator bridges a cavity in the substrate on which the resonator is constructed. The resonator is constructed by creating a cavity in the substrate and filling the same with a sacrificial material that can be rapidly removed from the cavity after the deposition of the various layers making up the resonator. The surface of the filled cavity is polished to provide a RMS variation in height of less than 0.5 μm. A first electrode is deposited on the polished surface to a thickness that assures that the RMS variation in height of the metallic layer is less than 2 μm. The piezoelectric layer is deposited on the first electrode and the second electrode is then deposited on the piezoelectric layer. The sacrificial material is then removed from the cavity by opening vias into the cavity and removing the material through the vias. The preferred sacrificial material is phophor-silica-glass.

DETAILED DESCRIPTION OF THE INVENTION

Figure 1:
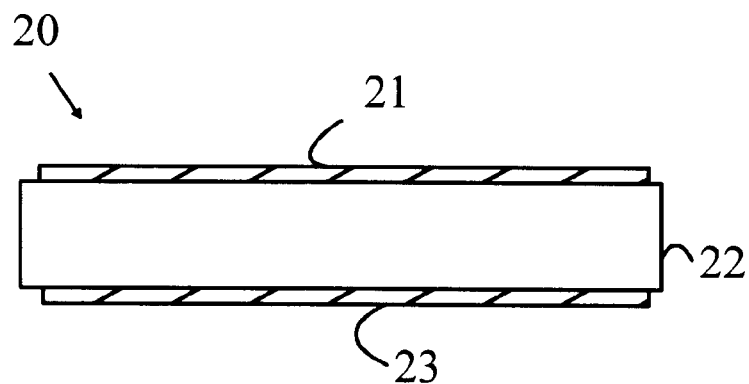
FIG. 1 is a cross-section of FBAR resonator.
Figure 2:
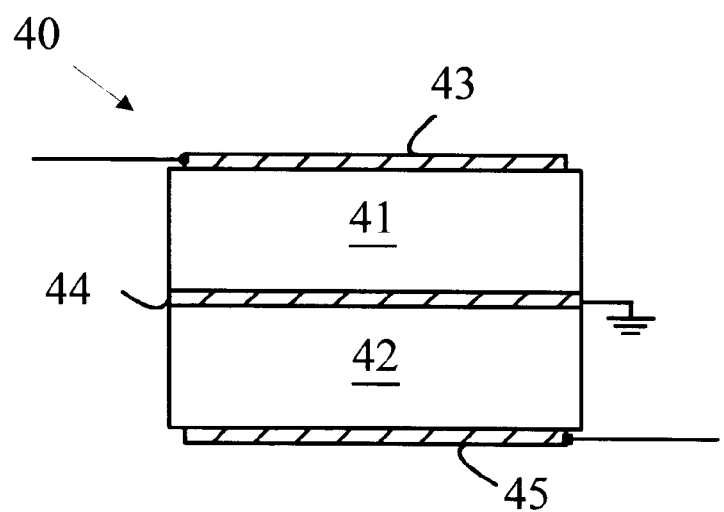
FIG. 2 is a cross-section of an SBAR resonator.

The present invention may be more easily understood with reference to FIGS. 1 and 2 which are cross-sectional views of an FBAR and an SBAR, respectively. Referring to FIG. 1, FBAR 20 includes bottom and top electrodes 23 and 21, respectively, which sandwich a portion of a sheet of piezoelectric (PZ) material 22. The preferred PZ material is aluminum nitride, AlN. The electrodes used in resonator 20 are preferably made of molybdenum; however, embodiments employing other materials may also be constructed.

These devices use bulk longitudinal acoustic waves in the thin film PZ material. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a notch filter. The mechanical resonant frequency is the frequency for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions of the order of 100 μm and few μm in thickness.

Refer now to FIG. 2, which is a cross-sectional view of an SBAR 40. An SBAR provides electrical functions analogous to those of a band-pass filter. SBAR 40 is basically two FBAR filters that are mechanically coupled. A signal across electrodes 43 and 44 at the resonance frequency of PZ layer 41 will transmit acoustical energy to PZ layer 42. The mechanical oscillations in PZ layer 42 are converted to an electrical signal across electrodes 44 and 45 by the PZ material.

The manner in which an FBAR and SBAR are constructed according to the present invention may be more easily understood with reference to FIGS. 3–7 which are cross-sectional views of a portion of a wafer 101 on which an FBAR 110 is constructed by the method of the present invention. The present invention utilizes a sacrificial layer comprising a material that is much more easily etched than the thermal oxides utilized in prior art methods based on sacrificial layers. In the preferred embodiment of the present invention, the sacrificial layer is constructed from phosphor-silica-glass (PSG).

Figure 3:
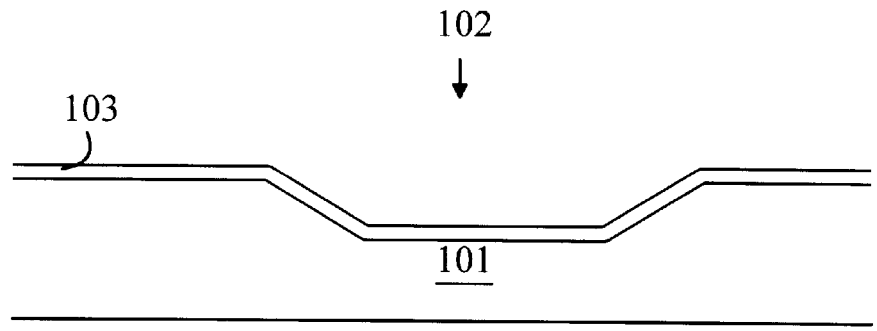
FIGS. 3–7 are cross-sectional views of a portion of a wafer on which an FBAR is constructed by the method of the present invention.

Referring to FIG. 3, a pit 102 is etched into substrate 101 which is preferably a conventional silicon wafer of the type utilized in integrated circuit fabrication. The pit is preferably less than 30 μm. It should be noted that the depth of the cavity under the FBAR needs to be only sufficient to accommodate the displacement created by the piezoelectric layer. Hence, a pit having a depth of a few μm is sufficient.

A thin layer of thermal oxide 103 is grown on the surface of the wafer to prevent phosphorous from the PSG from diffusing into the layer. Such diffusion would convert the silicon to a conductor, which would interfere with the electrical operation of the final device.

Figure 4:
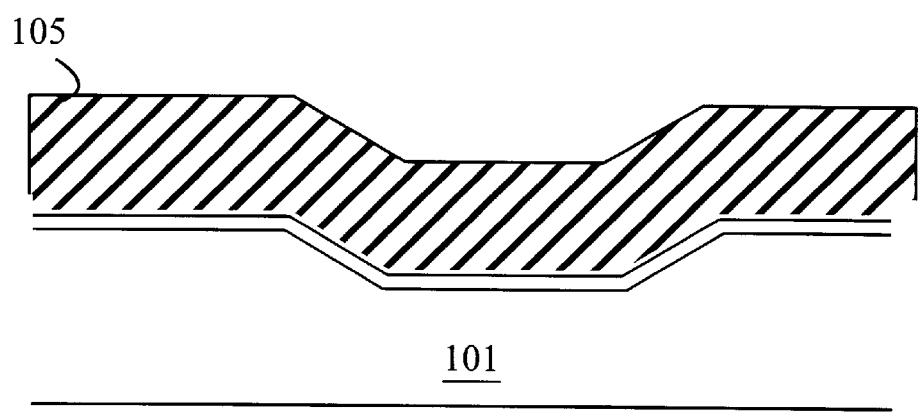

Referring to FIG. 4, a PSG layer is then deposited over the wafer. The PSG is deposited at a temperature of ~450° C. using a silane and $P_2O_5$ sources to form a soft glass like material which is approximately 8% phosphorous. This low temperature process is well known to those skilled in the art, and hence, will not be discussed in detail here. The PSG is the preferred choice for a sacrificial layer because it is a very clean, inert material that can be deposited at the relatively low temperature and can be etched in a dilute $H_2O$:HF solution at a very high etch rate. At a dilution ratio of 10:1, etch rates on the order of 3 μm per minute are obtained.

Unfortunately, a native PSG sacrificial layer is a poor base for constructing an acoustical resonator. At the atomic level the surface of such deposited films are atomically very rough. An acoustical resonator of the FBAR/SBAR type requires a piezoelectric material in which the crystals grow in columns that are perpendicular to the plane of the electrodes. Attempts to grow well-collimated piezoelectric films on the surface of a PSG layer result, at best, in poor polycrystalline material that exhibits little or no piezoelectric effects because the many facets on the rough surface initiate crystal growth in a variety of directions.

Figure 5:
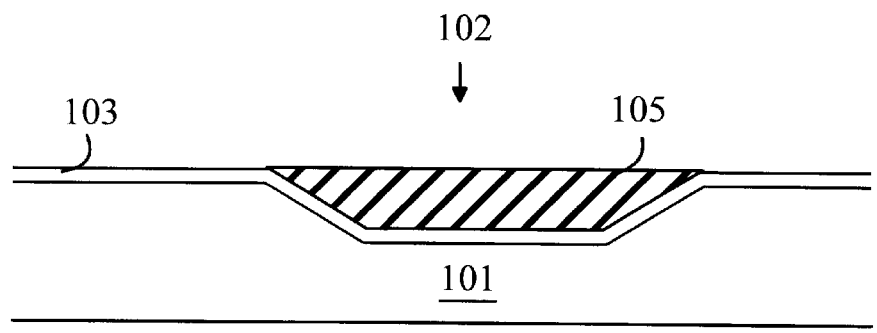

The present invention overcomes this difficulty by polishing the PSG surface to provide an atomically smooth surface. Referring to FIG. 5, the surface of the PSG layer 105 is first planarized by polishing with a slurry to remove the portion of the PSG layer outside of pit 102. The remaining PSG can then be polished using a more refined slurry. Alternatively, a single more refined slurry can be used for both polishing steps if the additional polishing time is not objectionable. The goal is to create a "mirror" like finish.

The cleaning of these wafers is also critical. The slurry will leave bits of silica grit on the wafer. This grit must be removed. In the preferred embodiment of the present invention, this is accomplished by using a second polishing wheel with a stiff, hard pad such as Polytex™ (Rodel, Conn.) De-ionized water is used as the lubricant. After being polished, the wafers are kept in de-ionized water until ready for the final cleaning step. The wafers should not be allowed to dry between the last polish step and the last cleaning step. The last cleaning step consists of dipping the wafers in a series of tanks that hold various chemicals. Each tank is subjected to ultrasonic agitation. Such cleaning benches are well known to the art, and hence, will not be discussed in detail here. A cleaning bench of the Megasonic™ type available from Ameramade, Calif. U.S.A. has been found to be adequate.

The present invention is based on the surprising finding that such a smooth surface provides a base for the deposition of highly textured c-axis piezoelectric material demonstrating excellent piezoelectric properties in spite of the fact that it does not contain a crystalline structure that "seeds" the piezoelectric layer.

The grit consists of silica particulates. In the preferred embodiment of the present invention, a slurry made by Rodel (#1508) which is an ammonia based slurry of silica particulates is utilized.

While the above discussion has indicated a specific polishing and cleaning regime, any polishing and cleaning regime which provides a surface of the requisite smoothness may be utilized. In the preferred embodiment of the present invention, the final surface has a RMS (root-mean-squared) variation in height of less than 0.5 $\mu$m as measured with an atomic force microscope probe.

Figure 6:
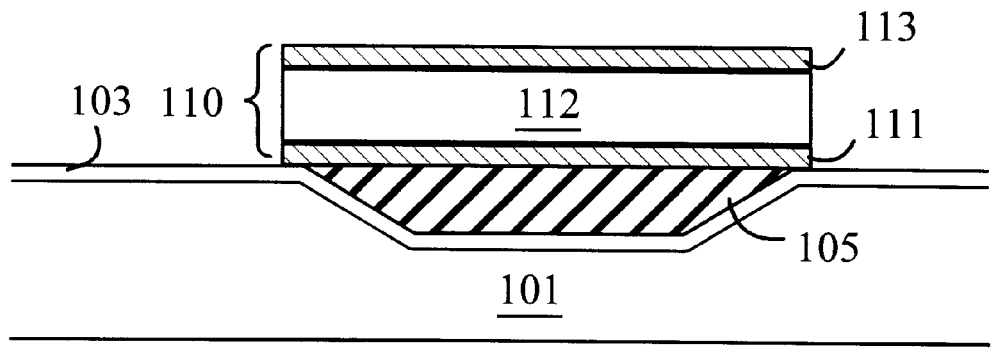

After the surface is cleaned, the bottom electrode 111 of the FBAR 110 is deposited as shown in FIG. 6. The preferred electrode material is molybdenum; However, other materials will be apparent to those skilled in the art. For example, the electrodes may be constructed from Al, W, Au, Pt, or Ti. Molybdenum is preferred because of its low thermo-elastic loss. For example, Mo has approximately 56 times less thermo-elastic loss than Al.

The thickness of the bottom electrode is also important. Thicker layers are rougher than thinner layers. As noted above, maintaining a smooth surface for the deposition of the piezoelectric layer is crucial to the performance of the final resonator. Hence, the thickness of the bottom electrode is preferably less than 1000 A. The Mo is preferably deposited utilizing sputtering. This provides a Mo layer that has a RMS variation in height of less than 2 $\mu$m.

After the bottom electrode has been deposited, the piezoelectric layer 112 is deposited. The preferred material for the piezoelectric layer is AlN, which is also deposited by sputtering. Since the deposition of AlN to form a piezoelectric layer is well known in the art, this deposition process will not be discussed in detail here. In the preferred embodiment of the present invention, the piezoelectric layer has a thickness between 0.1 and 10 $\mu$m.

Finally, the top electrode 113 is deposited. The top electrode is also preferably constructed from Mo. However, the thickness of this electrode is less critical, since it does not influence the deposition of the piezoelectric layer.

Figure 7:
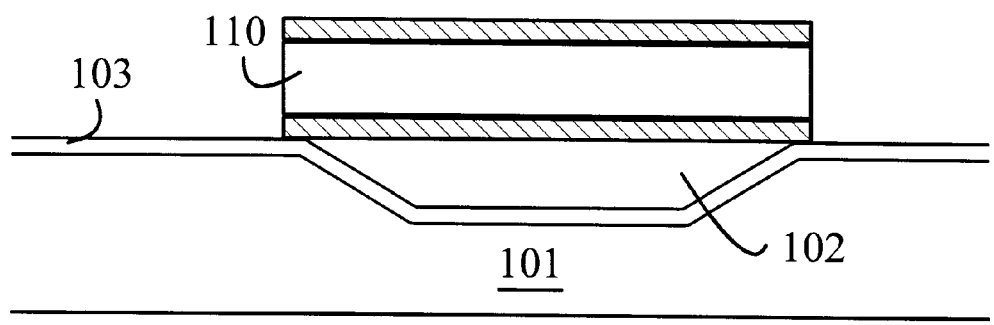

After the FBAR structure is deposited, vias are opened to the underlying sacrificial layer 105 and the PSG removed by etching in dilute $H_2O$:HF solution as shown in FIG. 7. This leaves FBAR 110 suspended over the original pit 102.

The above example has utilized the construction of an FBAR. However, it will be obvious to those skilled in the art from the preceding discussion that an SBAR can be constructed utilizing the same process. In the case of an SBAR, an additional piezoelectric layer and electrode must be deposited. Since the second piezoelectric layer is constructed on the top electrode of the "FBAR", the thickness of the top electrode must also be kept to <1000 A to provide a suitable surface for depositing the second piezoelectric layer.

While the above-described embodiments of the present invention utilize a sacrificial layer constructed from PSG, other materials may also be used. For example, other forms of glass such as BPSG or spin-on-glass may be utilized. In addition, there are plastics such as polyvinyl, polypropylene and polystyrene that can be deposited either by spinning on the material or depositing in special chambers. These sacrificial layers can be removed using an organic stripper or $O_2$ plasma etch. As with the PSG sacrificial layer, polishing is also crucial with these materials, as the surfaces of these materials as deposited are not atomically smooth.

Various modifications to the present invention will become apparent to those skilled in the art from the foregoing description and accompanying drawings. Accordingly, the present invention is to be limited solely by the scope of the following claims.

What is claimed is:

1. An acoustical resonator comprising:
   a first electrode comprising a conducting sheet having a RMS variation in height of less than 2 $\mu$m;
   a second electrode comprising a conducting sheet;
   a layer of piezoelectric material sandwiched between said first and second electrodes.

2. The acoustical resonator of claim 1 wherein said first electrode comprises molybdenum.

3. The acoustical resonator of claim 1 wherein said layer of piezoelectric material comprises AlN.

4. The acoustical resonator of claim 1 further comprising a substrate having a cavity in a surface thereof, said first electrode bridging said cavity.

5. The acoustical resonator of claim 4 wherein said cavity is less than 30 $\mu$m deep.

6. The acoustical resonator of claim 4 wherein said surface of said substrate comprises an electrically insulating layer.

7. A method for fabricating an acoustical resonator on a substrate having a top surface, said method comprising steps of:
   generating a depression in said top surface;
   filling said depression with a sacrificial material, said filled depression having an upper surface level with said top surface of said substrate, said upper surface having a RMS variation in height of less than 0.5 $\mu$m;
   depositing a first electrode on said upper surface;
   depositing a layer of piezoelectric material on said first electrode;
   depositing a second electrode on said layer of piezoelectric material; and
   removing said sacrificial material from said depression.

8. The method of claim 7 wherein said sacrificial material comprises a material chosen from the group consisting of PSG, BPSG, spin-on-glass, polyvinyl, polypropylene and polystyrene.

9. The method of claim 7 wherein said step of filling said depression comprises the steps of:
   depositing a layer of said sacrificial material over said depression;
   planarizing said deposited layer; and
   polishing said planarized layer.

10. The method of claim 9 further comprising the step of providing a layer of an electrically insulating material on the surface of said substrate and depression prior to depositing said layer of sacrificial material, said electrically insulating material preventing a diffusion of elements in said sacrificial material from diffusing into said substrate.

11. The method of claim 7 wherein said first electrode comprises molybdenum.

12. The method of claim 7 wherein said layer of piezo-electric material comprises AlN.

13. The method of claim 7 wherein said depression is less than 30 $\mu$m deep.

* * * * *

(12) EX PARTE REEXAMINATION CERTIFICATE (8743rd)

United States Patent
Ruby et al.

(10) Number: US 6,060,818 C1
(45) Certificate Issued: Dec. 13, 2011

(54) SBAR STRUCTURES AND METHOD OF FABRICATION OF SBAR.FBAR FILM PROCESSING TECHNIQUES FOR THE MANUFACTURING OF SBAR/BAR FILTERS

(75) Inventors: Richard C. Ruby, Menlo Park, CA (US); Yogesh Desai, San Jose, CA (US); Donald R. Bradbury, Palo Alto, CA (US)

(73) Assignee: Avago Technologies Wireless IP (Singapore) Pte. Ltd., Singapore (SG)

Reexamination Request:
No. 90/010,854, Jun. 2, 2010

Reexamination Certificate for:
Patent No.: 6,060,818
Issued: May 9, 2000
Appl. No.: 09/088,964
Filed: Jun. 2, 1998

(51) Int. Cl.
*H03H 9/17* (2006.01)
*H03H 9/00* (2006.01)

(52) U.S. Cl. ................ 310/363; 310/349; 29/25.35
(58) Field of Classification Search ............ 310/363
See application file for complete search history.

(56) References Cited

To view the complete listing of prior art documents cited during the proceeding for Reexamination Control Number 90/010,854, please refer to the USPTO's public Patent Application Information Retrieval (PAIR) system under the Display References tab.

*Primary Examiner* — Linh M. Nguyen

(57) ABSTRACT

An acoustical resonator and a method for making the same. A resonator according to the present invention includes a layer of piezoelectric material sandwiched between first and second electrodes. The first electrode includes a conducting sheet having a RMS variation in height of less than 2 μm. The resonator bridges a cavity in a substrate on which the resonator is constructed. The resonator is constructed by creating a cavity in the substrate and filling the same with a sacrificial material that can be rapidly removed from the cavity after the deposition of the various layers making up the resonator. The surface of the filled cavity is polished to provide a RMS variation in height of less than 0.5 μm. The first electrode is deposited on the polished surface to a thickness that assures that the RMS variation in height of the metallic layer is less than 2 μm. The piezoelectric layer is deposited on the first electrode and the second electrode is then deposited on the piezoelectric layer. The sacrificial material is then removed from the cavity by opening vias into the cavity and removing the material through the vias. The preferred sacrificial material is phophor-silica-glass.

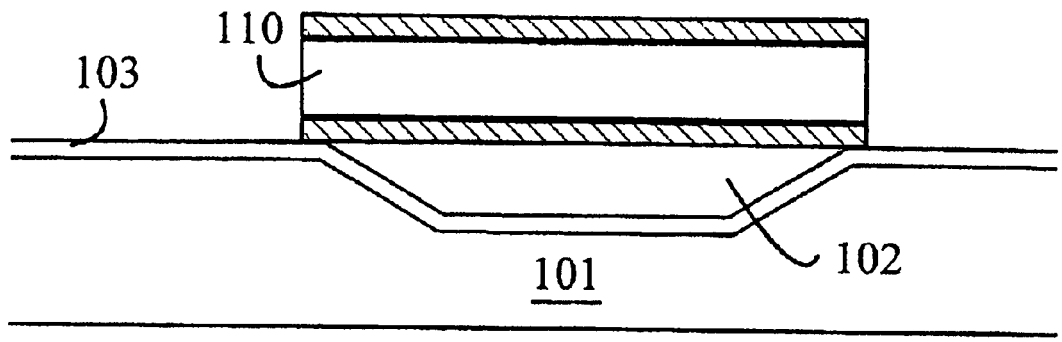

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY PARAGRAPHS OF THE SPECIFICATION AFFECTED BY AMENDMENT ARE PRINTED HEREIN.

Figure 8:
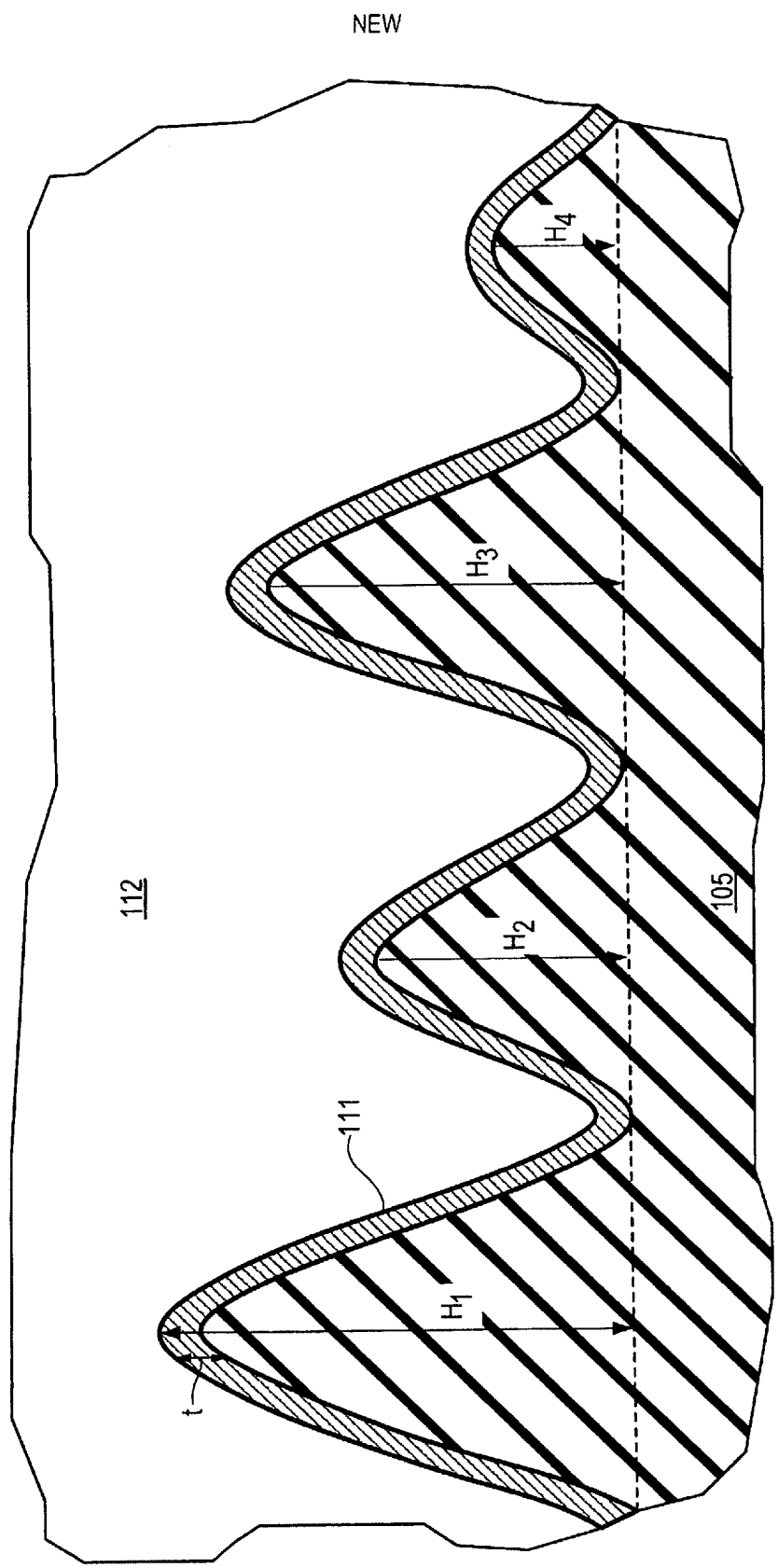

Column 3. line 36:

*FIG. 8 is a cross-sectional view of a portion of an FBAR device.*

Column 5, lines 12-17:

The present invention is based on the surprising finding that such a smooth surface provides a base for the deposition of highly textured c-axis pierzoelectric material demonstrating excellent piezoelectric properties in spite of the fact that it does not contain a crystalline structure that "seeds" the piezoelectric layer. *Notably, in a highly textured c-axis piezoelectric material, the c-axis orientations of the crystals of the piezoelectric material are well-collimated, and as such are parallel with one another and perpendicular to the plane of the electrodes (e.g., bottom electrode 23 and top electrode 21).*

Column 6, between lines 4-5:

*FIG. 8 is a cross-sectional view of a portion of FBAR 110. Specifically, FIG. 8 is an enlarged portion of the FBAR 110 to illustrate variation in height of the surface of the sacrificial layer 105 at the interface of the bottom electrode 111. Notably, FIG. 8 shows a portion of the FBAR 110 depicted in FIG. 6 enlarged to show the interface of the sacrificial layer 105, the bottom electrode 111 and the piezoelectric layer 112, after forming of the piezoelectric layer 112 but before removal of the sacrificial layer 105, which reveals the pit 102.*

*FIG. 8 depicts four "humps" in the sacrificial layer 105 after the completion of the cleaning of the wafer described above. The "humps" are left after the removal of silica grit that is left by the slurry used in polishing the sacrificial layer 105 as described above. The first hump has a first height, $H_1$, the second hump has a second height, $H_2$, the third hump has a third height, $H_3$, and the fourth hump has a fourth height, $H_4$. For the purposes of illustration, only four humps are shown. The root mean squared (RMS) variation in the height of the upper surface of the sacrificial layer 105 comprised of the four humps depicted is less than 0.5 µm. As noted above, the thickness (shown as "t" in FIG. 8) of the bottom electrode 111 is preferably less than 1000 Å (0.1 µm). The RMS variation in height of the bottom electrode 111 is less than 2 µm. Accordingly, the bottom electrode 111 has a thickness "t" of less than 1000 Å (0.1 µm) and an RMS variation in height of less than 2 µm.*

THE DRAWING FIGURES HAVE BEEN CHANGED AS FOLLOWS:

New FIG. 8 has been added.

AS A RESULT OF REEXAMINATION, IT HAS BEEN DETERMINED THAT:

The patentability of claims 7-9, and 11-13 is confirmed.

Claims 1 and 10 are determined to be patentable as amended.

Claims 2-6, dependent on an amended claim, is determined to be patentable.

New claims 14-49 are added and determined to be patentable.

1. An acoustical resonator comprising:
   a first electrode comprising a conducting sheet having a RMS variation in height of less than 2 µm;
   a second electrode comprising a conducting sheet;
   a layer of *highly textured c-axis* piezoelectric material sandwiched between said first and second electrodes.

10. The method of claim 9 further comprising the step of providing a layer of an electrically insulating material on the surface of said substrate and depression prior to depositing said layer of sacrificial material, said electrically insulating material preventing [a diffusion of] elements in said sacrificial material from diffusing into said substrate.

*14. The method of claim 9, further comprising after the polishing of the planarized layer, cleaning the planarized layer.*

*15. The method of claim 14, wherein the cleaning comprises further polishing the planarized layer.*

*16. The method of claim 14, wherein the polishing comprises applying de-ionized water as a lubricant.*

*17. The method of claim 14, further comprising, after the polishing, subjecting the planarized layer to ultrasonic agitation.*

*18. The method of claim 17, further comprising, before the ultrasonic agitation, submerging the planarized layer in deionized water.*

*19. A method for fabricating an acoustical resonator on a substrate having a top surface, the method comprising:*
   *generating a depression in the top surface;*
   *filling the depression with a sacrificial material, the filled depression having an upper surface level with the top surface of the substrate, the upper surface having a RMS variation in height of less than 0.5 µm;*
   *depositing a first electrode on the upper surface;*
   *over the first electrode, growing a layer of piezoelectric material having a c-axis orientation that is perpendicular to a plane of the first electrode;*
   *depositing a second electrode on the layer of piezoelectric material; and*
   *removing the sacrificial material from the depression.*

*20. The method of claim 19, wherein the sacrificial material comprises a material chosen from the group consisting of PSG or BPSG, spin-on-glass, polyvinyl, polypropylene and polystyrene.*

*21. The method of claim 19, wherein the filling of the depression comprises:*
   *depositing a layer of the sacrificial material over the depression;*
   *planarizing the deposited layer; and*
   *polishing the planarized layer.*

22. The method of claim 21, further comprising after the polishing of the planarized layer, cleaning the planarized layer.

23. The method of claim 22, wherein the cleaning comprises further polishing the planarized layer.

24. The method of claim 22, wherein the polishing comprises applying de-ionized water as a lubricant.

25. The method of claim 22, further comprising, after the polishing, subjecting the planarized layer to ultrasonic agitation.

26. The method of claim 25, further comprising, before the ultrasonic agitation, submerging the planarized layer in deionized water.

27. The method of claim 21, further comprising: providing a layer of an electrically insulating material on the surface of the substrate and depression prior to depositing the layer of sacrificial material, wherein the electrically insulating material prevents elements in the sacrificial material from diffusing into the substrate.

28. The method of claim 19, wherein the first electrode comprises molybdenum.

29. The method of claim 19, wherein the layer of piezoelectric material comprises AlN.

30. The method of claim 19, wherein the depression is less than 30 µm deep.

31. An acoustical resonator comprising:
a first electrode comprising a conducting sheet having a thickness of less than 0.1 µm and a RMS variation in height of less than 2 µm;
a second electrode comprising a conducting sheet; and
a layer of piezoelectric material disposed between the first and second electrodes and having a c-axis orientation that is perpendicular to a plane of the first electrode.

32. An acoustical resonator as claimed in 31, wherein the layer of piezoelectric material has a thickness between 0.1 µm and 10 µm.

33. An acoustical resonator as claimed in 31, wherein the first electrode comprises molybdenum.

34. An acoustical resonator as claimed in 31, wherein the layer of piezoelectric material comprises AlN.

35. An acoustical resonator as claimed in 31, further comprising a substrate having a cavity in a surface thereof, wherein the first electrode bridges the cavity.

36. An acoustical resonator as claimed in 31, wherein the cavity is less than 30 µm deep.

37. An acoustical resonator as claimed in 35, wherein the surface of the substrate comprises an electrically insulating layer.

38. A method for fabricating an acoustical resonator on a substrate having a top surface, the method comprising:

generating a depression in the top surface;
filling the depression with a sacrificial material, wherein the filled depression has an upper surface level with the top surface of the substrate, the upper surface having a RMS variation in height of less than 0.5 µm;
depositing a first electrode on the upper surface, the first electrode having a thickness of less than 0.1 µm;
depositing a layer of piezoelectric material on the first electrode;
depositing a second electrode on the layer of piezoelectric material; and
removing the sacrificial material from the depression.

39. A method as claimed in claim 38, wherein the sacrificial material comprises a material chosen from the group consisting of PSG, BPSG, spin-on-glass, polyvinyl, polypropylene and polystyrene.

40. A method as claimed in claim 38, wherein the filling of the depression comprises:
depositing a layer of the sacrificial material over the depression;
planarizing the deposited layer; and
polishing the planarized layer.

41. The method of claim 40, further comprising after the polishing of the planarized layer, cleaning the planarized layer.

42. The method of claim 41, wherein the cleaning comprises further polishing the planarized layer.

43. The method of claim 41, wherein the polishing comprises applying de-ionized water as a lubricant.

44. The method of claim 41, further comprising, after the polishing, subjecting the planarized layer to ultrasonic agitation.

45. The method of claim 44, further comprising, before the ultrasonic agitation, submerging the planarized layer in deionized water.

46. A method as claimed in claim 40, the method further comprising providing a layer of an electrically insulating material on the surface of the substrate and depression prior to depositing the layer of sacrificial material, the electrically insulating material preventing elements in the sacrificial material from diffusing into the substrate.

47. The method as claimed in claim 38, wherein the first electrode comprises molybdenum.

48. The method as claimed in claim 38, wherein the layer of piezoelectric material comprises AlN.

49. The method as claimed in claim 38, wherein the depression is less than 30 µm deep.

* * * * *